(12) United States Patent
Hamasaki et al.

(10) Patent No.: US 8,610,163 B2
(45) Date of Patent: *Dec. 17, 2013

(54) METHOD FOR MANUFACTURING SEMICONDUCTOR LIGHT EMITTING DEVICE

(75) Inventors: Hiroshi Hamasaki, Kanagawa-ken (JP); Akihiro Kojima, Kanagawa-ken (JP); Yoshiaki Sugizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/406,840

(22) Filed: Feb. 28, 2012

(65) Prior Publication Data
US 2012/0153344 A1 Jun. 21, 2012

Related U.S. Application Data

(62) Division of application No. 12/797,711, filed on Jun. 10, 2010, now Pat. No. 8,148,183.

(30) Foreign Application Priority Data

Aug. 3, 2009 (JP) ................................. 2009-180402

(51) Int. Cl.
*H01L 33/36* (2010.01)
(52) U.S. Cl.
USPC .................. 257/99; 257/98; 257/E33.062
(58) Field of Classification Search
USPC .................................................... 257/98, 99
See application file for complete search history.

(56) References Cited

U.S. PATENT DOCUMENTS

| | | | |
|---|---|---|---|
| 6,071,795 A | 6/2000 | Cheung et al. | |
| 7,241,667 B2 | 7/2007 | Park et al. | |
| 8,110,421 B2 * | 2/2012 | Sugizaki et al. | 438/26 |
| 2006/0003553 A1 | 1/2006 | Park et al. | |

(Continued)

FOREIGN PATENT DOCUMENTS

| | | |
|---|---|---|
| JP | 2005-123489 | 5/2005 |
| JP | 2005-347647 | 12/2005 |

(Continued)

OTHER PUBLICATIONS

United States Office Action for U.S. Appl. No. 12/797,711 mailed on Jun. 23, 2011.

(Continued)

*Primary Examiner* — Alexander Ghyka
(74) *Attorney, Agent, or Firm* — White & Case LLP

(57) ABSTRACT

According to one embodiment, a semiconductor light emitting device includes a semiconductor layer including a first surface, a second surface opposite to the first surface, and a light emitting layer; a p-side electrode provided on the second surface of the semiconductor layer in a region including the light emitting layer; an n-side electrode provided on the second surface of the semiconductor layer in a region not including the light emitting layer; an insulating film being more flexible than the semiconductor layer, the insulating film provided on the second surface and a side surface of the semiconductor layer, and the insulating film having a first opening reaching the p-side electrode and a second opening reaching the n-side electrode; a p-side interconnection layer provided on the insulating film and connected to the p-side electrode; and an n-side interconnection layer provided on the insulating film and connected to the n-side electrode.

22 Claims, 6 Drawing Sheets

(56) References Cited

U.S. PATENT DOCUMENTS

| | | | |
|---|---|---|---|
| 2007/0058357 A1 | 3/2007 | Yamaguchi et al. | |
| 2008/0142809 A1 | 6/2008 | Jant et al. | |
| 2008/0210955 A1 | 9/2008 | Uenura et al. | |
| 2010/0006864 A1* | 1/2010 | Steigerwald | 257/88 |
| 2010/0148198 A1 | 6/2010 | Sugizaki et al. | |
| 2012/0012871 A1* | 1/2012 | Hsia et al. | 257/98 |
| 2012/0181568 A1* | 7/2012 | Hsia et al. | 257/99 |
| 2012/0286240 A1* | 11/2012 | Yu et al. | 257/13 |

FOREIGN PATENT DOCUMENTS

| | | |
|---|---|---|
| JP | 2007081234 | 3/2007 |
| JP | 2007115874 | 5/2007 |
| JP | 2007173465 | 7/2007 |
| JP | 2007299935 | 11/2007 |
| JP | 2008-140873 | 6/2008 |
| JP | 2009099823 | 5/2009 |

OTHER PUBLICATIONS

Japanese Office Action dated Jul. 7, 2010 corresponding to U.S. Appl. No. 12/797,711, filed Jun. 10, 2010.

Japanese Office Action dated Oct. 19, 2010 for Japanese Application Serial No. 2009-180402.

Chinese Office Action for Chinese Application No. 201010243804.6 mailed on Dec. 11, 2012.

Japanese Office Action for Japanese Application No. 2011-243112 mailed on Oct. 23, 2012.

Chinese Office Action issued on Jul. 11, 2013 in counterpart CN Application No. 2010102438046, along with English translation.

Taiwanese Office Action issued on Jul. 26, 2013 in counterpart TW Application No. 099124724, along with English translation.

* cited by examiner

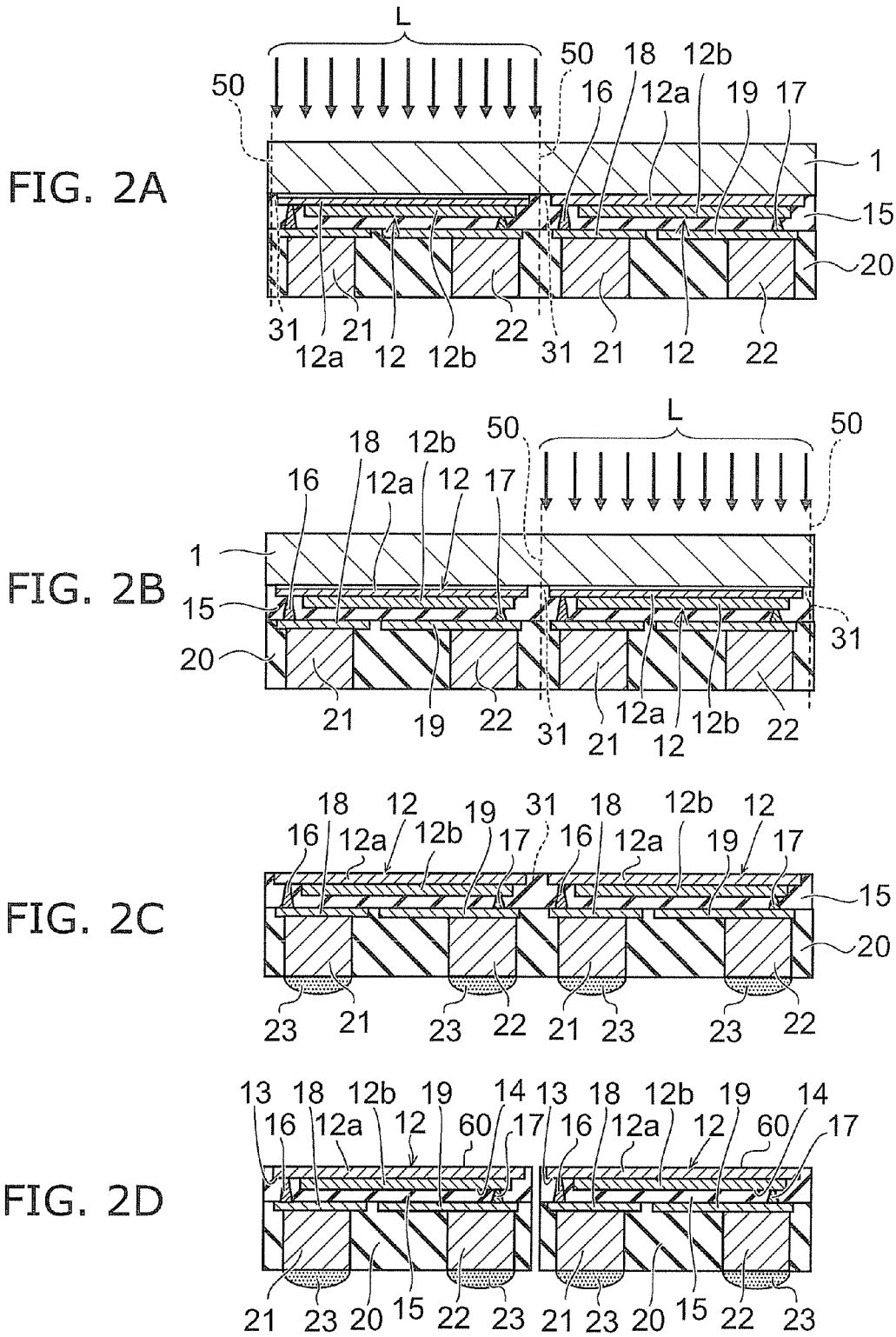

METHOD FOR MANUFACTURING SEMICONDUCTOR LIGHT EMITTING DEVICE

CROSS-REFERENCE TO RELATED APPLICATIONS

This application is a Division of application Ser. No. 12/797,711 filed Jun. 10, 2010; the entire contents of which are incorporated herein by reference.

This application is based upon and claims the benefit of priority from the prior Japanese Patent Application No. 2009-180402, filed on Aug. 3, 2009; the entire contents of which are incorporated herein by reference.

BACKGROUND

Light emitting devices using a blue or near-ultraviolet LED (light emitting diode) as a light source and emitting white light by means of phosphors have found wide applications in illumination devices as well as backlight sources for image display devices, and have been increasingly required for higher efficiency. Conventionally, a surface-mounted light emitting device with a light emitting element chip mounted on a lead frame and resin-molded is commercially available. Furthermore, for the purpose of increasing light extraction efficiency, a technique is proposed for removing the support substrate of the light emitting layer by the laser lift-off process (e.g., U.S. Pat. No. 7,241,667).

BRIEF DESCRIPTION OF THE DRAWINGS

FIGS. 1A to 2D are schematic cross-sectional views showing a method for manufacturing a semiconductor light emitting device of this embodiment;

DETAILED DESCRIPTION

Figure 1A:
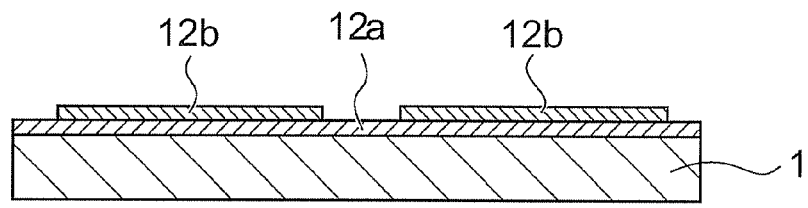

According to one embodiment, a method for manufacturing a semiconductor light emitting device includes forming a separation groove on a major surface of a substrate. A semiconductor layer including a light emitting layer is formed on the substrate. The separation groove separates the semiconductor layer into a plurality of elements. The method includes forming an insulating film on the major surface of the substrate. The insulating film covers the semiconductor layer and a bottom surface of the separation groove provided on the substrate. The method includes separating the substrate from the semiconductor layer by irradiating the semiconductor layer with laser light from an surface of the substrate opposite to the major surface. An edge portion of irradiation area of the laser light is positioned near an edge portion of the semiconductor layer neighboring the separation groove.

Embodiments will now be described with reference to the drawings.

FIG. 2D is a schematic cross-sectional view of a semiconductor light emitting device of an embodiment. Two instances, for example, of the semiconductor light emitting device separated from the wafer state are shown in FIG. 2D.

The semiconductor light emitting device of this embodiment includes a light emitting element 12 and a interconnection section. The light emitting element 12 includes a semiconductor layer 12a and a semiconductor layer 12b. The semiconductor layer 12b has a structure in which a light emitting layer is sandwiched between a p-type cladding layer and an n-type cladding layer. The semiconductor layer 12a is illustratively of n-type and functions as a lateral current path. However, the conductivity type of the semiconductor layer 12a is not limited to n-type, but may be p-type.

The semiconductor layer 12b is not provided on a portion of the opposite surface of the semiconductor layer 12a from the top surface 60. An n-side electrode 13 is formed on that portion. A p-side electrode 14 is formed on the opposite surface of the semiconductor layer 12b from the surface provided with the semiconductor layer 12a.

The opposite side of the semiconductor layer 12a and the semiconductor layer 12b from the top surface 60 is covered with an insulating film 15. The top surface 60 is exposed from the insulating film 15. An n-side interconnection layer 18 and a p-side interconnection layer 19 are formed on the opposite surface of the insulating film 15 from the top surface 60 and separated from each other.

The n-side electrode 13 is electrically connected to the n-side interconnection layer 18 through an n-side contact portion 16. The p-side electrode 14 is electrically connected to the p-side interconnection layer 19 through a p-side contact portion 17.

An n-side metal pillar 21 is provided below the n-side interconnection layer 18. A p-side metal pillar 22 is provided below the p-side interconnection layer 19. The periphery of the n-side metal pillar 21, the periphery of the p-side metal pillar 22, the n-side interconnection layer 18, and the p-side interconnection layer 19 are covered with a resin 20.

An external terminal 23 illustratively made of a solder ball or metal bump and to be connected to an external circuit is provided on the lower end surface of the n-side metal pillar 21 and the p-side metal pillar 22 exposed from the resin 20.

The semiconductor layer 12a is electrically connected to the external terminal 23 through the n-side electrode 13, the n-side contact portion 16, the n-side interconnection layer 18, and the n-side metal pillar 21. The semiconductor layer 12b is electrically connected to the external terminal 23 through the p-side electrode 14, the p-side contact portion 17, the p-side interconnection layer 19, and the p-side metal pillar 22.

Even if the semiconductor layers 12a, 12b are thin, mechanical strength can be maintained by thickening the n-side metal pillar 21, the p-side metal pillar 22, and the resin 20. Furthermore, in the case where the individual semiconductor light emitting device is mounted on a circuit board or the like via the external terminals 23, the stress applied to the light emitting element 12 through the external terminals 23 can be absorbed and relaxed by the n-side metal pillar 21 and the p-side metal pillar 22.

Next, a method for manufacturing a semiconductor light emitting device of this embodiment is described with reference to FIGS. 1A to 3C.

First, as shown in FIG. 1A, a stacked body of a semiconductor layer 12a and a semiconductor layer 12b is formed on the major surface of a substrate 1. The semiconductor layer 12b, after being formed entirely on the semiconductor layer 12a, is patterned using a resist mask, not shown, and separated into a plurality. For instance, in the case where the light emitting layer is made of a nitride semiconductor, the semiconductor layers 12a, 12b can be crystallized on the substrate 1 illustratively made of sapphire.

Figure 1B:
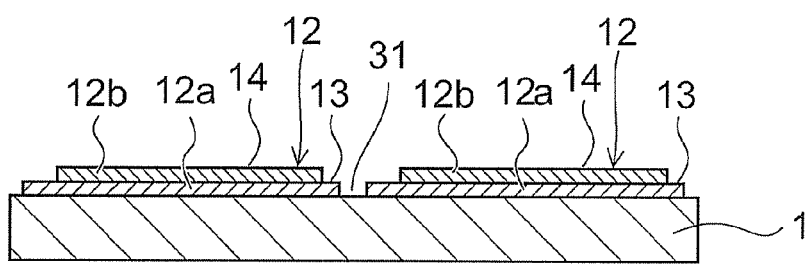
Figure 3A:
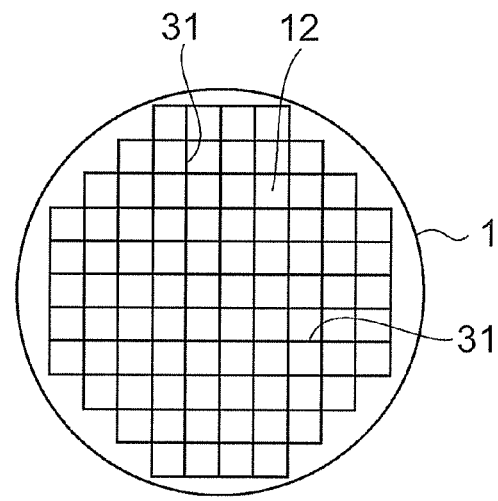
FIGS. 3A to 3C are schematic views showing a separation groove in the semiconductor light emitting device of this embodiment.
Figure 3B:
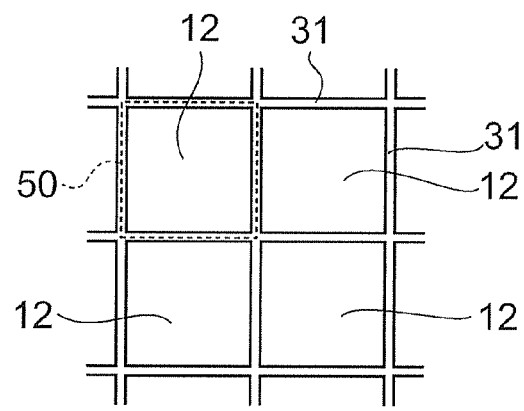

Next, part of the semiconductor layer 12a is removed illustratively by RIE (reactive ion etching) or laser ablation to form a separation groove 31 as shown in FIG. 1B. This separation groove 31 separates the semiconductor layer 12a and the semiconductor layer 12b into a plurality of light emitting elements 12 on the major surface of the substrate 1. The separation groove 31 is illustratively formed like a lattice as shown in FIG. 3A. The planar shape of each light emitting element 12 is formed generally like a quadrangle whose periphery is surrounded like a frame by the separation groove 31.

A p-side electrode 14 is formed on the surface of the semiconductor layer 12b. An n-side electrode 13 is formed on a portion of the surface of the semiconductor layer 12a not covered with the semiconductor layer 12b.

Figure 1C:
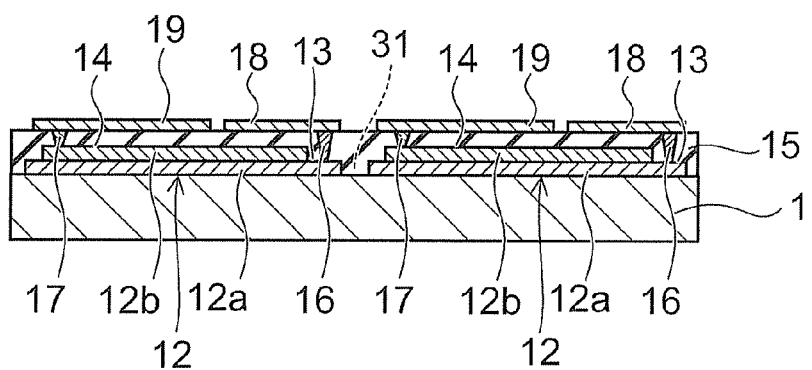

Next, as shown in FIG. 1C, an insulating film 15 covering the semiconductor layer 12a and the semiconductor layer 12b is formed on the substrate 1. The insulating film 15 is illustratively made of an organic material such as photosensitive polyimide. Thus, the separation groove 31 is filled with the insulating film 15.

Next, an opening reaching the n-side electrode 13 and an opening reaching the p-side electrode 14 are formed in the insulating film 15. Then, an n-side contact portion 16 is provided in the opening reaching the n-side electrode 13, and a p-side contact portion 17 is provided in the opening reaching the p-side electrode 14. Furthermore, on the insulating film 15, an n-side interconnection layer 18 connected to the n-side contact portion 16 and a p-side interconnection layer 19 connected to the p-side contact portion 17 are formed.

The n-side contact portion 16, the p-side contact portion 17, the n-side interconnection layer 18, and the p-side interconnection layer 19 are illustratively formed by the plating process. That is, a seed metal, not shown, is formed on the inner wall of the opening formed in the insulating film 15 and on the surface of the insulating film 15, and then metal deposition is performed.

Figure 1D:
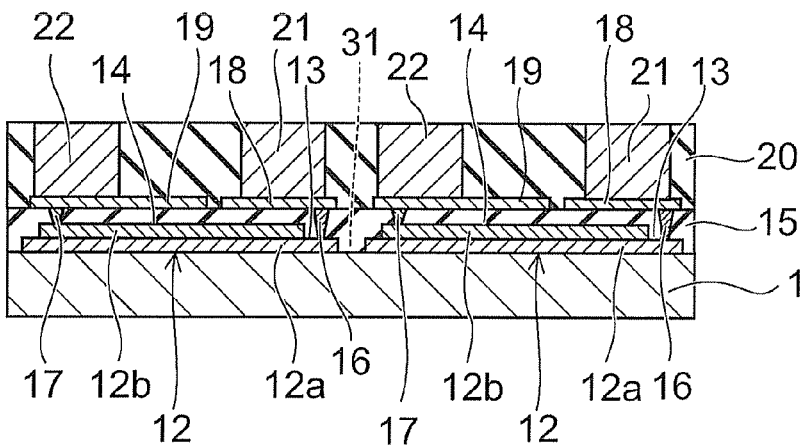

Next, as shown in FIG. 1D, an n-side metal pillar 21 is provided on the n-side interconnection layer 18, and a p-side metal pillar 22 is provided on the p-side interconnection layer 19. The periphery of these n-side metal pillar 21 and p-side metal pillar 22 is filled with a resin 20. The resin 20 covers the n-side interconnection layer 18, the p-side interconnection layer 19, the periphery of the n-side metal pillar 21, and the periphery of the p-side metal pillar 22. The upper surface of the n-side metal pillar 21 and the p-side metal pillar 22 is exposed from the resin 20. The resin 20 is illustratively composed of epoxy resin, silicone resin, or fluororesin mixed with a filler. The resin 20 is provided also on the insulating film 15 on the separation groove 31.

The n-side contact portion 16, the p-side contact portion 17, the n-side interconnection layer 18, the p-side interconnection layer 19, the n-side metal pillar 21, and the p-side metal pillar 22 can be made of such a material as copper, gold, nickel, and silver. Among them, it is more preferable to use copper, which has good thermal conductivity, high migration resistance, and superior contact with the insulating film 15.

After the structure of FIG. 1D is obtained, the processes of FIGS. 2A to 2D follow. It is noted that FIGS. 2A to 2D are depicted with the vertical positional relationship of the substrate 1 and the light emitting element 12 turned upside down with respect to FIGS. 1A to 1D.

FIG. 2A shows the process for removing the substrate 1 by the laser lift-off process. The semiconductor layer 12a is irradiated with the laser light L. The laser light L is applied to the semiconductor layer 12a from the opposite surface (rear surface) side of the substrate 1, opposite to the major surface on which the light emitting element 12 is formed. The wavelength of the laser light L is such that the substrate 1 is transparent (transmissive) to the laser light L and that the wavelength falls in the absorption region of the semiconductor layer 12a.

When the laser light L reaches the interface between the substrate 1 and the semiconductor layer 12a, the semiconductor layer 12a near the interface is thermally decomposed by absorbing the energy of the laser light L. For instance, in the case where the semiconductor layer 12a is made of GaN, it is decomposed into Ga and nitrogen gas. Ga is left on the semiconductor layer 12a side. This thermal decomposition forms a small gap between the substrate 1 and the semiconductor layer 12a, thereby separating the substrate 1 from the semiconductor layer 12a.

The laser light L is applied to the light emitting element 12 illustratively one by one. Here, the edge portion of the irradiation area of laser light L is positioned in the separation groove 31. The edge portion 50 of the irradiation area of laser light L is indicated by dashed lines in FIGS. 2A and 3B. The generally quadrangular region inside the edge portion 50 is the irradiation area for one shot of laser light.

Upon irradiation with the laser light L, a gas is generated by vaporization due to abrupt thermal decomposition of the semiconductor layer 12a. At this time, impact of the high-pressure gas on the semiconductor layers 12a, 12b may cause cracking, crystal dislocation, fracture and the like in the semiconductor layers 12a, 12b. The gas generated by thermal decomposition of the semiconductor layer 12a can diffuse in the plane direction through a gap produced between the substrate 1 and the semiconductor layer 12a. However, the outside of the irradiation area of laser light L remains in the solid phase without being laser heated. Hence, the solid-phase portion restricts the diffusion of the gas, and the gas pressure is likely to increase at its edge portion 50. Furthermore, a large stress is likely to act on the edge portion 50 of the irradiation area of laser light L because of the energy difference, temperature difference, phase difference and the like between the applied portion and the unapplied portion of laser light L. Hence, the semiconductor layers 12a, 12b tend to be damaged particularly at the edge portion 50 of the irradiation area of laser light L.

Thus, in this embodiment, the edge portion 50 of the irradiation area of laser light L is positioned in the separation groove 31. The semiconductor layers 12a, 12b do not exist in the separation groove 31, and hence the edge portion 50 of the irradiation area of laser light L is not positioned in the semiconductor layers 12a, 12b. Thus, damage to the semiconductor layers 12a, 12b can be prevented.

Furthermore, the insulating film 15 illustratively made of polyimide, which is more flexible than the semiconductor layers 12a, 12b, is provided in the separation groove 31. Deformation of this insulating film 15 relaxes stress and can prevent a large stress from acting on the semiconductor layers 12a, 12b. Furthermore, the gas can also be released through the gap between the substrate 1 and the insulating film 15 in the separation groove 31, produced by the deformation of the insulating film 15.

Furthermore, if the separation groove 31 is empty, then because of a large refractive index difference from that of the semiconductor layer 12a, the wave front of laser light L near the separation groove 31 is greatly refracted toward the semiconductor layer 12a, and the electric field intensity is greatly disturbed. This causes disturbances in the intensity of the laser light L near the end portion of the semiconductor layer 12a, and unfortunately, the removing condition of the substrate 1 by the laser lift-off process is likely to be unstable.

In contrast, in this embodiment, the separation groove 31 is filled with the insulating film 15. This decreases the refractive index difference and reduces the bending of the wave front of laser light L. Thus, the intensity distribution of laser light L can be made more stable, and the instability of the removing condition can be prevented.

It is preferable that the separation groove 31 be filled with the insulating film 15. However, even if it is not filled, if the insulating film 15 is provided near the periphery of the semiconductor layer 12a on the major surface of the substrate 1, the aforementioned wave front bending of laser light L due to refractive index difference is suppressed. This can achieve the effect of stabilizing the intensity distribution and facilitating stabilization of the removing condition.

As described above, this embodiment can prevent damage to the semiconductor layers 12a, 12b when the laser light L is applied thereto. This makes it possible to prevent the decrease of light emission efficiency and light extraction efficiency, and current leak.

Also for another light emitting element 12, as shown in FIG. 2B, the laser light L is applied so that the edge portion 50 of the irradiation area of laser light L is positioned in the separation groove 31. Thus, also in that light emitting element 12, the substrate 1 can be separated from the semiconductor layer 12a without damage to the semiconductor layers 12a, 12b.

Application of the laser light L as described above is performed for all the light emitting elements 12 to separate the substrate 1 from the semiconductor layers 12a, 12b throughout the wafer. Furthermore, the application of laser light L also to the separation groove 31 reduces the adhesive strength between the insulating film 15 provided in that separation groove 31 and the substrate 1. This allows the substrate 1 to be removed from above the light emitting element 12. The area where the insulating film 15 is in contact with the substrate 1 in the separation groove 31 is much smaller than the overall area of the wafer. Hence, even if the insulating film 15 in the separation groove 31 is not completely separated from the substrate 1, the substrate 1 can be removed by simply reducing the adhesive strength.

Furthermore, the irradiation area of laser light L shown in FIG. 2A in which the application of laser light L is performed earlier is slightly overlapped in the separation groove 31 with the irradiation area of laser light L shown in FIG. 2B in which the irradiation with laser light L is performed later. This avoids occurrence of an unirradiated portion with the laser light L in the insulating film 15 provided in the separation groove 31, reliably reduces the adhesive strength between that insulating film 15 and the substrate 1, and facilitates stripping the substrate 1.

Here, the overlapping portion of laser light L is located on the insulating film 15. Hence, as compared with the case where the separation groove 31 is empty, the wave front bending of laser light L due to refractive index difference is suppressed. This can achieve the effect of stabilizing the intensity distribution and facilitating stabilization of the removing condition.

Alternatively, the adjacent irradiation areas may not overlap in the separation groove 31. In this case, an unirradiated portion with the laser light L occurs in the insulating film 15 provided in the separation groove 31. Some unirradiated portion is allowed to occur in the insulating film 15 to the extent that removing of the substrate 1 is not affected.

By first applying laser light to the light emitting elements 12 on the outer side of the wafer, the gas generated by applying laser light to the light emitting elements 12 on the inner side of the wafer can be released to the space outside the wafer through the gap between the semiconductor layer 12a on the outer side and the substrate 1 and through the gap between the insulating film 15 in the separation groove 31 around that semiconductor layer 12a and the substrate 1. That is, laser light is first applied to the outer side of the wafer so that the release route of the gas to the outside of the wafer is successively connected to the inner side. This can prevent damage to each light emitting element 12 throughout the wafer.

Even if the separation groove 31 is filled with the insulating film 15, the gas pressure can be relaxed through the gap which is produced by deformation of the resin or by fine removing of the resin from the substrate 1 when the gas pressure increases. Thus, the effect of being able to reduce damage to the semiconductor layers 12a, 12b is achieved.

Figure 3C:
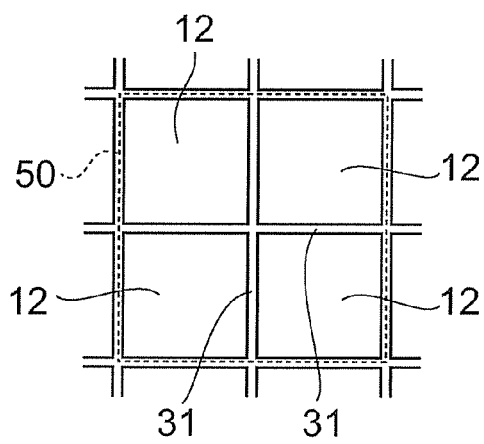

The application of laser light L is not limited to one-by-one application to the light emitting element 12 separated by the separation groove 31, but may be performed in blocks of a plurality of light emitting elements 12. FIG. 3C shows an example in which laser light application for one shot is illustratively performed on four light emitting elements 12. Also in the case of application in blocks of a plurality of light emitting elements 12, the edge portion 50 of the irradiation area of laser light L is positioned in the separation groove 31.

After the substrate 1 is removed, as shown in FIG. 2C, a solder ball, metal bump or the like functioning as an external terminal 23 is formed on the lower end portion of the n-side metal pillar 21 and the p-side metal pillar 22. Subsequently, dicing is performed along the separation groove 31 for singulation as shown in FIG. 2D. The singulation may be performed for each single light emitting element 12, or in blocks of a plurality of light emitting elements 12.

The aforementioned processes up to dicing are each performed collectively in the wafer state, hence enabling production at low cost. Furthermore, the package structure including the protective resin, interconnections, and electrodes is formed at the wafer level. This facilitates downsizing in which the planar size of the semiconductor light emitting device is close to the planar size of the bare chip (light emitting element 12).

Figure 4A:
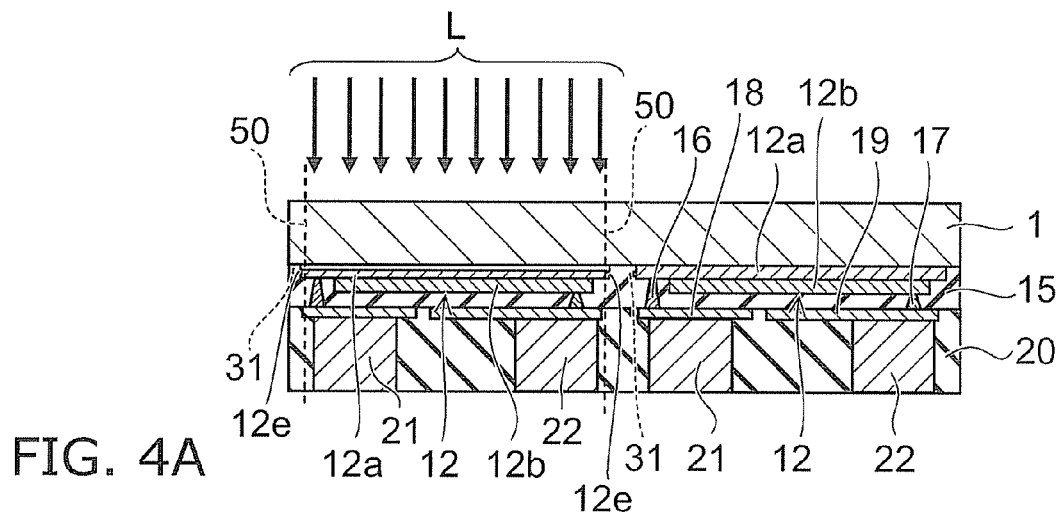
FIG. 4A to FIG. 5C are schematic cross-sectional views showing a method for manufacturing a semiconductor light emitting device of another embodiment.

Next, FIG. 4A shows an embodiment in which the edge portion 50 of the irradiation area of laser light L is positioned at the edge portion 12e of the semiconductor layer 12a neighboring the separation groove 31 or slightly inside that edge portion 12e on the semiconductor layer 12a side.

When the laser light L is applied, damage to the semiconductor layers 12a, 12b is likely to occur at the boundary where the energy, temperature, phase and the like greatly vary. Depending on the laser irradiation condition and the irradiated object, the boundary where the energy, temperature, phase and the like greatly vary does not necessarily coincide with the edge portion 50 of the irradiation area. Some energy and heat of the laser light L may reach the portion outside that edge portion 50. In that case, the boundary where the energy, temperature, phase and the like greatly vary lies outside the edge portion 50 of the application area.

Thus, in the embodiment shown in FIG. 4A, the edge portion 50 of the irradiation area of laser light L is positioned at the edge portion 12e of the semiconductor layer 12a or slightly inside that edge portion 12e on the semiconductor layer 12a side so that the boundary where the energy, temperature, phase and the like greatly vary lies in the separation groove 31. This can prevent damage to the semiconductor layers 12a, 12b because the semiconductor layers 12a, 12b do not exist in the separation groove 31 including the boundary where the energy, temperature, phase and the like greatly vary.

Furthermore, because the insulating film 15 in the separation groove 31 is not covered with the application area of laser light L, action of excessive energy and heat on the insulating film 15 in the separation groove 31 can be suppressed. This can prevent degradation of reliability due to cracks in the insulating film 15 and the stress to the semiconductor layers 12a, 12b due to large deformation of the insulating film 15.

Figure 4B:
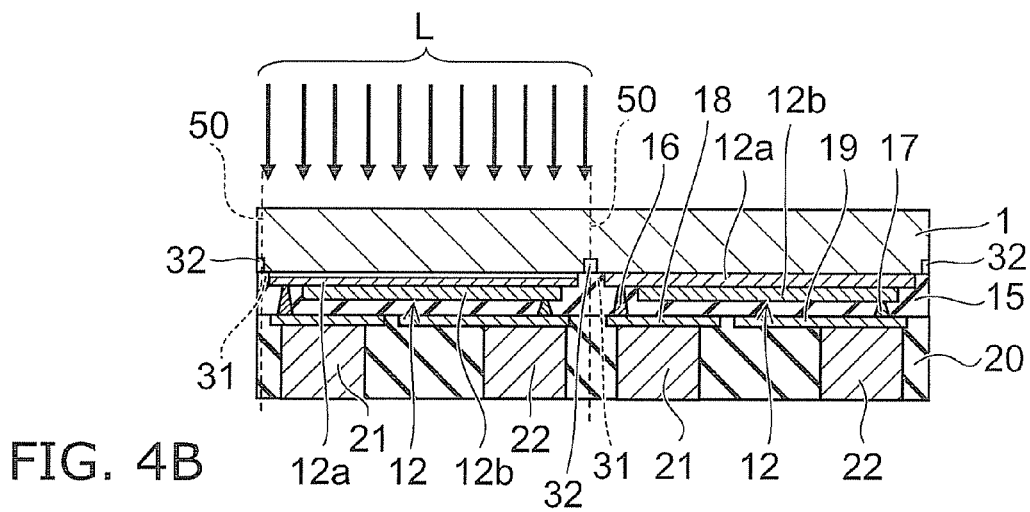

Next, FIG. 4B shows an embodiment in which a groove 32 is formed in the substrate 1. The groove 32 is formed in a portion of the substrate 1 opposed to the separation groove 31. The groove 32 is illustratively formed like a lattice throughout the wafer, like the separation groove 31 shown in FIG. 3A. The width of the groove 32 is smaller than the width of the separation groove 31, and the edge portion of the semiconductor layer 12a does not overlap the groove 32.

When the laser light L is applied, the gas generated at the interface between the substrate 1 and the semiconductor layer 12a can be released to the outside of the wafer through the groove 32. The application of laser light L results in decreasing the adhesive strength between the insulating film 15 in the separation groove 31 and the substrate 1, or deforming the insulating film 15. This allows the gas generated at the interface between the substrate 1 and the semiconductor layer 12a to easily pass between the insulating film 15 and the substrate 1 and reach the groove 32.

By forming the groove 32, the gas generated upon the application of laser light L can be effectively released, and the increase of gas pressure near the light emitting element 12 can be prevented. In this case, application of laser light may be performed not from the outer side of the wafer. Because the groove 32 for gas release is already formed throughout the wafer, the gas generated can be released to the outside of the wafer through the groove 32 even if application of laser light is first performed on the inner side of the wafer.

After the separation groove 31 is formed in the process shown in FIG. 1B described above, the groove 32 is formed in a portion opposed to the separation groove 31. Subsequently, the insulating film 15 is formed on the major surface of the substrate 1. The insulating film 15 is supplied in a liquid or viscous state onto the major surface of the substrate 1, and then cured. Thus, if the width of the groove 32 is as small as e.g. 1 μm or less and the insulating film 15 is illustratively made of polyimide with relatively high viscosity, then the groove 32 can be left unfilled with the insulating film 15.

Figure 4C:
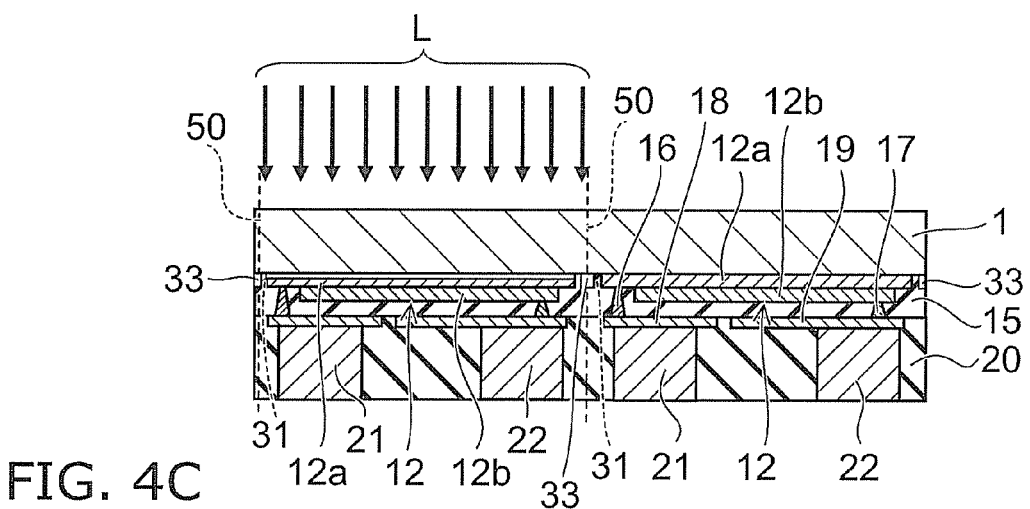

Alternatively, as shown in FIG. 4C, a groove 33 may be formed on the insulating film 15 side. The groove 33 is formed as a void in the insulating film 15 provided in the separation groove 31. The groove 33 is also illustratively formed like a lattice throughout the wafer, like the separation groove 31 shown in FIG. 3A. The width of the groove 33 is smaller than the width of the separation groove 31, and the edge portion of the semiconductor layer 12a does not overlap the groove 33.

Also in this case, when the laser light L is applied, the gas generated at the interface between the substrate 1 and the semiconductor layer 12a can be released to the outside of the wafer through the groove 33. Furthermore, application of laser light may be performed not from the outer side of the wafer. Because the groove 33 for gas release is already formed throughout the wafer, the gas generated can be released to the outside of the wafer through the groove 33 even if application of laser light is first performed on the inner side of the wafer.

After the process of FIG. 1D, a void can be formed in the insulating film 15 by laser ablation in which laser light is locally applied from the rear side of the substrate 1 to the insulating film 15 provided in the separation groove 31. This laser light has a narrower irradiation area than the laser light L for removing the substrate 1, and is narrowed like a spot. By this laser ablation, part of the insulating film 15 provided in the separation groove 31 can be vaporized to form a groove 33. Thus, at least the portion where the groove 33 is to be formed is preferably made of a resin vaporizable by laser ablation, such as polyester, polycarbonate, and polyurethane. Because the groove 33 is formed throughout the wafer, the vaporized resin is released to the outside of the wafer through the groove 33.

Figure 5A:
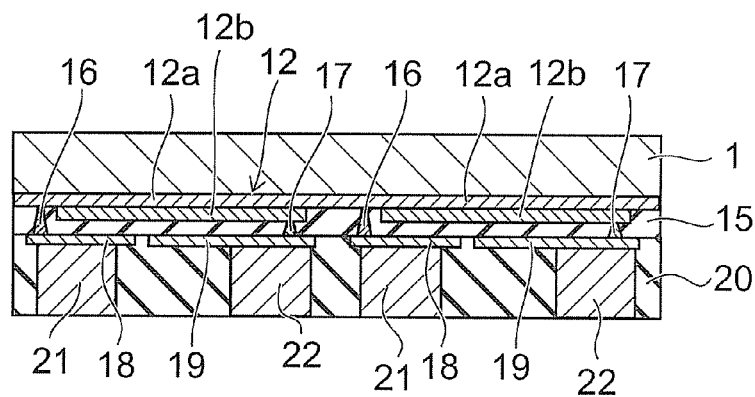
Figure 5B:
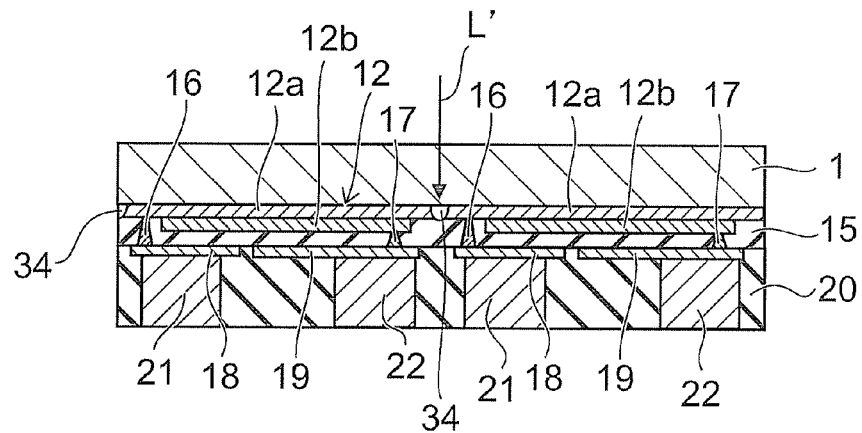
Figure 5C:
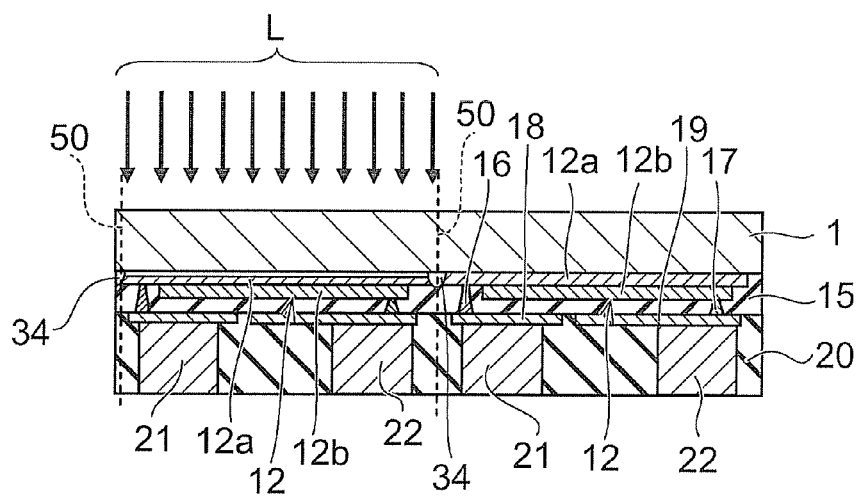

FIGS. 5A to 5C show another method for forming a separation groove separating the semiconductor layer 12a.

This method follows the process up to FIG. 1D without performing the process of forming the separation groove 31 at the stage shown in FIG. 1B described above. Hence, as shown in FIG. 5A, the semiconductor layer 12a is not separated but remains connected.

Then, as shown in FIG. 5B, laser ablation is performed in which laser light L' is locally applied from the rear side of the substrate 1 only to a portion where a separation groove is to be formed. This laser light L' has a narrower irradiation area than the laser light L for removing the substrate, and is narrowed like a spot. By this laser ablation, part of the semiconductor layer 12a is vaporized and removed. Thus, a separation groove 34 separating the semiconductor layer 12a is formed. Because the insulating film 15 is not provided in this separation groove 34, the separation groove 34 also functions as an release route for gas generated by the application of laser light L for stripping the substrate. The separation groove 34 is also illustratively formed like a lattice throughout the wafer.

To ensure complete separation of the semiconductor layer 12a, it is preferable to also remove, by laser ablation, a portion of the insulating film 15 in contact with the portion of the semiconductor layer 12a where the separation groove 34 is formed. Thus, that portion is preferably made of a material vaporizable by laser ablation, such as polyester, polycarbonate, and polyurethane described above. By removing part of the insulating film 15, the cross-sectional area of the route for gas release can also be increased to effectively release the gas.

To remove the substrate, as shown in FIG. 5C, the laser light L is applied so that the edge portion 50 of the irradiation area of laser light L is positioned in the separation groove 34 where the light emitting element 12 does not exist. This can prevent damage to the light emitting element 12. Furthermore, because the gas can be released through the separation groove 34, which is a void, the increase of gas pressure near the light emitting element 12 can be avoided more effectively.

Figure 6A:
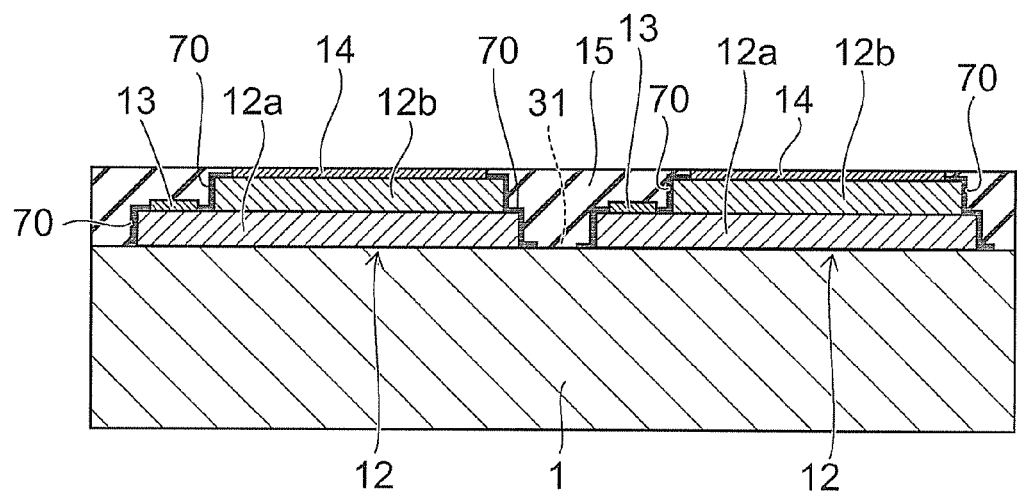
FIGS. 6A and 6B are schematic cross-sectional views of the semiconductor light emitting device of the another embodiment.

FIG. 6A shows a structure in which the side surface of the semiconductor layers 12a, 12b is covered with a passivation film 70 illustratively made of a dielectric such as silicon oxide and silicon nitride. This can suppress leak current and prevent degradation of reliability due to oxidation of the side surface of the semiconductor layers 12a, 12b. By separating the passivation film 70 in the separation groove 31, impact at the time of removing the substrate 1 by the laser lift-off process can be inhibited from propagating to the adjacent elements through the passivation film 70.

Figure 6B:
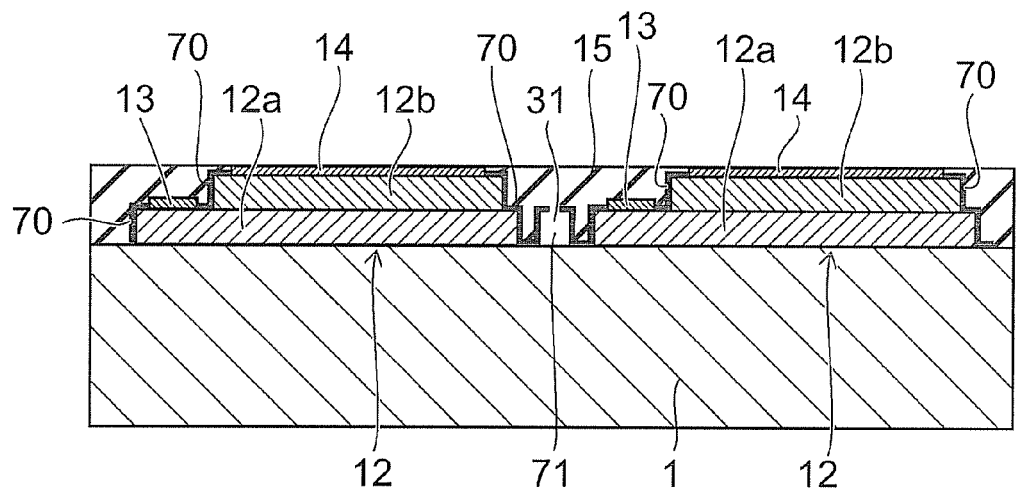

Furthermore, as shown in FIG. 6B, a void 71 can be formed below the passivation film 70 at the position of the separation groove 31. Thus, the release route for gas generated at the time of laser lift-off can be actively secured, and damage to the semiconductor layers 12a, 12b due to impact can be suppressed. The void 71 can be formed by forming a sacrificial layer in the separation groove 31 on the substrate 1 and removing the sacrificial layer by etching and the like.

The material, size, shape, layout and the like of the substrate, light emitting element, electrode, interconnection layer, metal pillar, insulating film, and resin can be variously modified by those skilled in the art, and such modifications are also encompassed within the scope of the invention as long as they do not depart from the spirit of the invention.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

The invention claimed is:

1. A semiconductor light emitting device comprising:
a semiconductor layer including a first surface, a second surface opposite to the first surface, and a light emitting layer;
a p-side electrode provided on the second surface of the semiconductor layer in a region including the light emitting layer;
an n-side electrode provided on the second surface of the semiconductor layer in a region not including the light emitting layer;
an insulating film being more flexible than the semiconductor layer, the insulating film provided on the second surface and a side surface of the semiconductor layer, and the insulating film having a first opening reaching the p-side electrode and a second opening reaching the n-side electrode;
a p-side interconnection layer provided on the insulating film and connected to the p-side electrode; and
an n-side interconnection layer provided on the insulating film and connected to the n-side electrode.

2. The device according to claim 1, further comprising:
a p-side contact portion provided in the first opening and connected to the p-side electrode; and
an n-side contact portion provided in the second opening and connected to the n-side electrode,
the p-side interconnection layer connected to the p-side electrode through the p-side contact portion, and the n-side interconnection layer connected to the n-side electrode through the n-side contact portion.

3. The device according to claim 1, wherein the insulating film includes a resin.

4. The device according to claim 3, wherein the resin is any of an epoxy resin, a silicone resin and a fluororesin.

5. The device according to claim 1, wherein the insulating film includes silicon oxide or silicon nitride.

6. The device according to claim 1, wherein the p-side interconnection and the n-side interconnection include copper.

7. The device according to claim 1, wherein the semiconductor layer is a nitride semiconductor.

8. The device according to claim 1, wherein an end face on a side of the first surface of the semiconductor layer, of the insulating film provided on the side surface of the semiconductor layer, is provided in the same plane as the first surface.

9. The device according to claim 1, wherein a planar shape of the semiconductor layer is formed a quadrangle, and the insulating film provided on the side surface of the semiconductor layer surrounds the semiconductor layer like a frame.

10. A semiconductor light emitting device comprising:
a semiconductor layer including a first surface, a second surface opposite to the first surface, and a light emitting layer;
a p-side electrode provided on the second surface of the semiconductor layer in a region including the light emitting layer;
an n-side electrode provided on the second surface of the semiconductor layer in a region not including the light emitting layer;
an insulating film being more flexible than the semiconductor layer, the insulating film provided on the second surface and a side surface continued from the first surface of the semiconductor layer, and the insulating film having a first opening reaching the p-side electrode and a second opening reaching the n-side electrode;
a p-side interconnection layer provided on the insulating film and connected to the p-side electrode;
an n-side interconnection layer provided on the insulating film and connected to the n-side electrode;
a p-side metal pillar provided on the p-side interconnection layer; and
an n-side metal pillar provided on the n-side interconnection layer,
the insulating film provided between the p-side metal pillar and the n-side metal pillar.

11. The device according to claim 10, further comprising:
a p-side contact portion provided in the first opening and connected to the p-side electrode; and
an n-side contact portion provided in the second opening and connected to the n-side electrode,
the p-side interconnection layer connected to the p-side electrode through the p-side contact portion, and the n-side interconnection layer connected to the n-side electrode through the n-side contact portion.

12. The device according to claim 10, wherein the insulating film includes:
a first insulating film provided between the second surface and the p-side interconnection layer, and between the second surface and the n-side interconnection layer; and
a second insulating film provided between a periphery of the p-side metal pillar and a periphery of the n-side metal pillar.

13. The device according to claim 12, wherein the first insulating film includes a resin.

14. The device according to claim 13, wherein the resin is any of an epoxy resin, a silicone resin and a fluororesin.

15. The device according to claim 12, wherein the first insulating film includes silicon oxide or silicon nitride.

16. The device according to claim 12, wherein the second insulating film includes a resin.

17. The device according to claim 10, wherein the p-side interconnection and the n-side interconnection include copper.

18. The device according to claim 10, wherein the p-side metal pillar and the n-side metal pillar include copper.

19. The device according to claim 10, wherein the insulating film is filled between the p-side metal pillar and the n-side metal pillar.

20. The device according to claim 10, wherein the semiconductor layer is a nitride semiconductor.

21. The device according to claim 10, wherein an end face on a side of the first surface of the semiconductor layer, of the insulating film provided on the side surface of the semiconductor layer, is provided in the same plane as the first surface.

22. The device according to claim 10, wherein a planar shape of the semiconductor layer is formed a quadrangle, and the insulating film provided on the side surface of the semiconductor layer surrounds the semiconductor layer like a frame.

* * * * *